United States Patent [19]

Prigent

[11] Patent Number: 5,404,112

[45] Date of Patent: Apr. 4, 1995

[54] TEST METHOD AND DEVICE FOR DIODES WITH EXPOSED JUNCTION ASSEMBLED IN PARALLEL

[75] Inventor: Jean-Luc Prigent, Brest, France

[73] Assignee: Thomson-CSF, Puteaux, France

[21] Appl. No.: 930,394

[22] PCT Filed: Jan. 10, 1992

[86] PCT No.: PCT/FR92/00018

§ 371 Date: Sep. 14, 1992

§ 102(e) Date: Sep. 14, 1992

[87] PCT Pub. No.: WO92/13282

PCT Pub. Date: Aug. 6, 1992

[30] Foreign Application Priority Data

Jan. 15, 1991 [FR] France ................... 91 00366

[51] Int. Cl.6 ............................................. G01R 1/04
[52] U.S. Cl. ......................................... 324/767; 324/501
[58] Field of Search ................... 324/158 D, 767, 501

[56] References Cited

U.S. PATENT DOCUMENTS 3,742,356  6/1993  Brock .................. 324/158 D

FOREIGN PATENT DOCUMENTS 2469808 of 0000 France .
3617588 of 0000 Germany .

OTHER PUBLICATIONS

Chi, et al. "Optical Probing and Testing," IBM Technical Disclosure Bulletin, vol. 25, No. 10, Mar. 1983, pp. 5052–5054.

Morohashi, et al., "Measurement of Minority-Carrier Diffusion," *Japanese Journal of Applied Physics*, vol. 22, No. 2-1, Feb. 1983, pp. 276–280.

Stengl, "High Voltage Planar Junctions Investigated," i IEEE Transactions on Electron Devices, vol. ED-34, No. 4, Apr. 1987, pp. 911–919.

*Primary Examiner*—Kenneth A. Wieder
*Assistant Examiner*—Barry C. Bowser
*Attorney, Agent, or Firm*—Pollock, Vande Sande & Priddy

[57] ABSTRACT

The method uses the photoelectric sensitivity of the diode junctions. It consists, in order to test a specific diode belonging to a group of diodes connected in parallel, in illuminating the junction of a diode in question with light belonging to the range of photoelectric sensitivity of the said junction, in connecting the group of diodes to the terminals of an electrical load and in noting the appearance, at the terminals of the said load, of a photocurrent denoting correct operation of the diode in question. When the group of diodes forms part of an assembly within which it is connected in series with other groups of diodes, the diode under test is illuminated by intermittent light while at least one diode of each of the other groups is illuminated continuously and while an attempt is made to detect an intermittent photocurrent passing through a load to the terminals of which the assembly is connected. In the figure can be seen a test device which comprises an array (1) of electroluminescent diodes and a photocurrent detector (2) which are driven by a computer (3).

3 Claims, 1 Drawing Sheet

TEST METHOD AND DEVICE FOR DIODES WITH EXPOSED JUNCTION ASSEMBLED IN PARALLEL

The present invention relates to checking of the correct operation of diodes with exposed junctions arranged in parallel within a group, several groups of diodes possibly being themselves connected together in series.

BACKGROUND OF THE INVENTION

Series-parallel assemblies of diodes, such as that represented in FIG. 1, are encountered especially in certain UHF antenna steering lenses used to produce electronic scanning in space. These lenses comprise a juxtaposition of phase-shift channels each enclosing, between two metal plates parallel to the direction of propagation of the beam, a stack of elongated strips which are arranged parallel to the wave front of the beam and which are each constituted by a printed circuit card supporting a network of conducting wires arranged in a ladder with rungs parallel to the direction of the electric field. The rungs are divided into two pieces linked by diodes which make it possible, on demand, to render them continuous or interrupted from the electrical point of view. This modifies their impedances and, consequently, the phase shift which the incident UHF wave undergoes. The various phase-shift combinations which it is possible to make the UHF wave undergo in its passage through the phase-shift channels make it possible to deflect the UHF beam, on demand, in various directions in order to produce scanning in space.

In order to prevent the short-circuiting of one diode disturbing the operation of all the other diodes of a strip, the interconnecting wires arranged along the uprights of the ladder are divided up. This leads to a distribution of the diodes into several groups within which they are connected in parallel in the same direction, the groups being themselves connected together in series in the same direction.

For more details on these strips and their assemblies of diodes within a UHF antenna steering lens, reference may be had to the French Patent FR-A-2,469,808.

In order to test the correct operation of the diodes of a strip, it is possible to supply the whole of the assembly from a chopping current generator and to check the presence of the current in each diode by moving the strip under a current measuring probe. However, at the UHF wavelengths envisaged, the short lengths of the connecting wires of the diodes which constitute the rungs of the ladder do not make for easy distinction between the currents flowing in the diodes and those flowing in the interconnecting wires constituting the rungs of the ladder.

Furthermore, the duration of the test is relatively long by reason of the time necessary for moving the strip and causing the diodes to come one by one under the current measuring probe.

The solution which consists in using as many current measuring probes as diodes, is unacceptable by reason of the high cost price of a current measuring probe.

SUMMARY OF THE INVENTION

The aim of the present invention is to combat these various drawbacks and to permit easily modifiable, rapid, reliable and low-cost testing of diodes in a parallel or series-parallel assembly.

It consists in utilizing the photoelectric sensitivity of the semiconducting junctions of the diodes based on silicon, gallium arsenide, etc.

Its subject is a test method for diodes with exposed junctions assembled into a series-parallel assembly, the said diodes being distributed into groups within which they are connected in parallel, the groups of diodes being themselves connected together in series. This method consists, in order to test a specific diode of the assembly, in intermittently illuminating the junction of the diode in question and in simultaneously illuminating, continuously, the junctions of at least one diode of each of the groups other than the one to which the diode in question belongs with pencil beams of light whose wavelengths belong to the range of opto-electric sensitivity of the said junctions, in connecting the series-parallel assembly of diodes to the terminals of an electrical load and in noting the appearance, at the terminals of the said load, of an intermittent photocurrent denoting correct operation of the diode in question.

Advantageously, this test method may comprise a supplementary step in the course of which the continuous illumination of the diode or diodes of each of the groups other than the one to which the diode in question belongs is ceased, in turn, in order to note the disappearance of the intermittent photocurrent at the terminals of the load and to deduce therefrom the absence of a short circuit within the group to which belong the diode or diodes whose junction has just ceased to be illuminated.

The subject of the invention is also a device for implementing the abovementioned methods.

Other characteristics and advantages of the invention will emerge from the description below of an embodiment given by way of example. This description will be given with respect to the drawing in which:

BRIEF DESCRIPTION OF THE DRAWINGS a FIG. 1 represents an example of series parallel assembly of diodes to be tested and a FIG. 2 represents a diagram of a device for implementing the test method according to the invention.

DETAILED DESCRIPTION OF THE INVENTION

Figure 1:
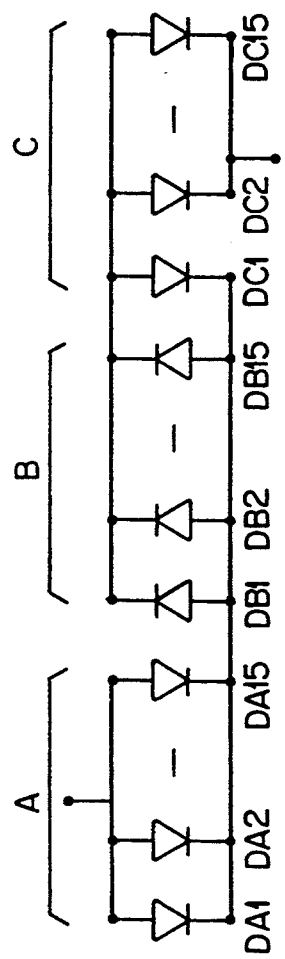

FIG. 1 gives an example of series-parallel assembly of diodes to be tested. The latter is composed of an assembly of forty five diodes with exposed junctions, that is to say not encapsulated or encapsulated in a material which is transparent to lightwaves in the range of photoelectric sensitivity of their junction. These diodes are arranged side by side on a strip of printed circuit, like the rungs of a ladder with interconnecting wires arranged on either side in the manner of the uprights of a ladder. They are interconnected in such a way as to be able to be simultaneously rendered conducting or blocking. From the electrical point of view, they are distributed into three groups A, B, C of fifteen diodes DA1, ... DA15, DB1, ... ,DB15, DC1, ... ,DC15 within which they are connected in parallel and in the same direction, the three groups A, B, C being themselves connected together in series and in the same direction. The series-parallel assembly of the diodes as it is represented, more so than a purely parallel assembly, makes it possible to circumscribe the effects of a short circuit at the site of a group of diodes.

Figure 2:
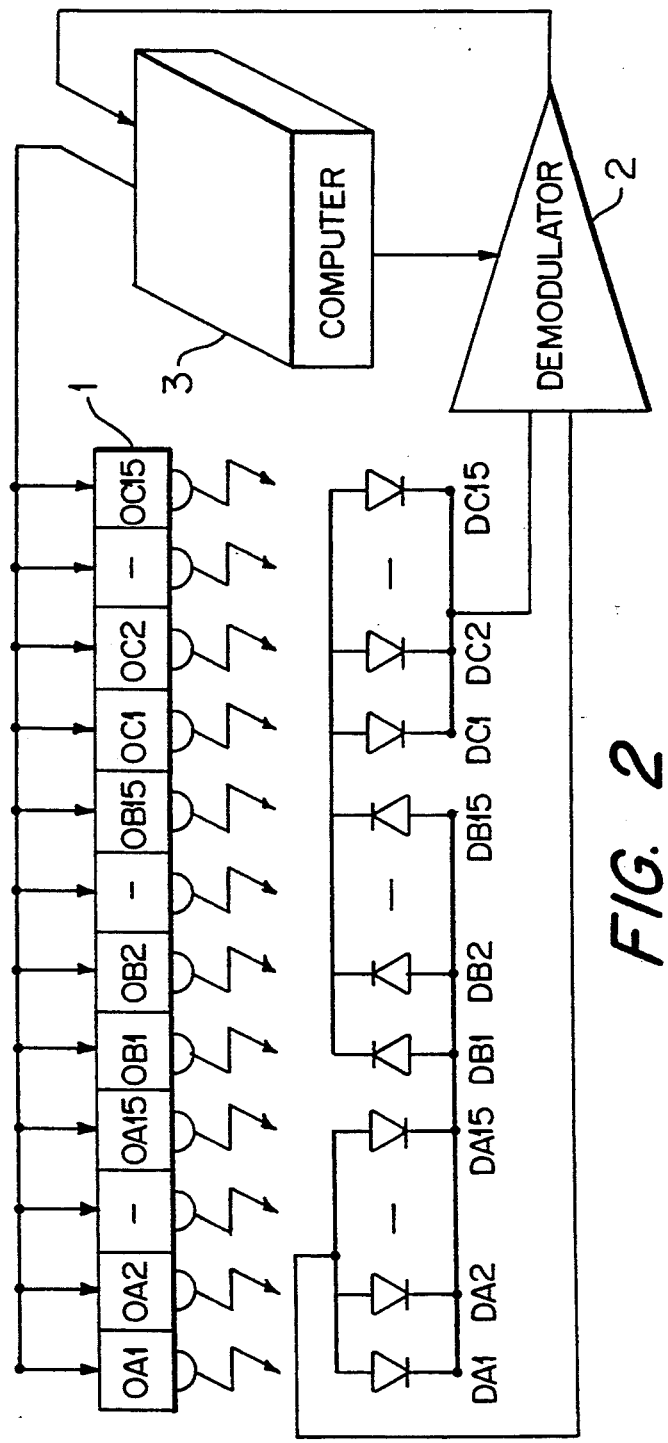

FIG. 2 illustrates a test device. This comprises an array 1 of electroluminescent diodes, a photocurrent detecting demodulator 2 whose input is connected to the terminals of the series-parallel assembly of diodes to be tested and a computer 3 individually controlling the illumination of the electroluminescent diodes of the array 1 and monitoring the photocurrent detecting demodulator 2.

The electroluminescent diodes OA1, . . . ,OA15, OB1, . . . ,OB15, OC1, . . . ,OC15 generate light whose wavelength belongs to the range of photoelectric sensitivity of the junctions of the diodes DA1, . . . DC15 of the assembly to be tested. Equal in number to the diodes of the assembly to be tested, they are distributed in the same arrangement as the latter. When the series-parallel assembly of diodes to be tested is in place in the test device, each electroluminescent diode OA1, . . . , OC15 finds itself facing the diode of the assembly to be tested which has the same rank in the group in question A, B or C and makes it possible to illuminate solely the junction of the latter. A collimation device equips each electroluminescent diode, as required, in order to limit the suface of their light beam so that it intercepts only the junction of the diode to be tested situated opposite. Each electroluminescent diode can also be a laser diode emitting a narrow pencil beam of light.

The photocurrent detecting demodulator 2 presents an internal input resistance which constitutes the electrical load of the series-parallel assembly of the diodes under test. It receives, from the computer 3, a square-wave alternating signal at the frequency at which the latter controls intermittent illumination of one of the diodes of the assembly under test so as to effect synchronous demodulation. It delivers, in response to the computer, a binary signal whose level testifies to the detection or non-detection of an intermittent current of the same repetition frequency in the assembly under test.

The computer 3 drives the array 1 of electroluminescent diodes and the demodulator 2 in such a way as to successively test all of the diodes DA1, . . . ,DC15 of the assembly according to the following procedure:

intermittent lighting of the electroluminescent diode illuminating the junction of the diode in question in the assembly, for example lighting the electroluminescent diode OA2 in order to test diode DA2 of the assembly by virtue of a square-wave alternating excitation signal;

simultaneous lighting, continuously, of the electroluminescent diodes illuminating the junctions of at least one diode of each of the groups other than that to which the diode in question belongs, which can correspond in the preceding example to continuous lighting of the electroluminescent diodes OB2 and OC2, and checking of the presence of an intermittent current in the assembly under test by taking account of the level of the output signal from the demodulator 2.

This test procedure for each diode of the assembly can be completed by a supplementary step consisting in extinguishing, in turn, the electroluminescent diodes (OB2 and OC2 in the preceding example) illuminating the diode junctions of each of the groups other than that to which the diode in question belongs in order to note, each time, the disappearance of the intermittent current flowing in the assembly under test.

The diode undergoing test (DA2 in the example in question), which has its junction illuminated intermittently, must behave, if it is serviceable, as an intermittent photoelectric current generator. This is not the case for the other diodes of the same group (A in the example in question) which remain blocking since their junctions are not illuminated.

The diodes (DB2 and DC2 in the example in question) of the other groups (B and C in the example in question) which have their junctions continuously illuminated behave as continuous photoelectric current generators arranged in series and in the same direction as the intermittent photoelectric current generator of the diode under test (DA2 in the example in question) and allow an intermittent photoelectric current to arrive at the demodulator 2 testifying to the correct operation of the diode under test.

When continuous illumination of the junctions of the diodes of each of the groups (B or C in the example in question) other than that to which the diode under test belongs is ceased, the intermittent photoelectric current must cease since it cannot overcome the threshold voltage of the diodes of these groups. If this is not the case, at least one of the diodes of the group whose illumination has been ceased is a short-circuit.

Once the test procedure for a diode (DA2 in the example in .question) is complete, the operations recommence for another diodes and so on until all the other diodes of the assembly have been tested.

In the case where the assembly of diodes to be tested exhibits only one group of diodes connected in parallel, the procedure is simplified since it is then sufficient to illuminate the junctions of the diodes of the group one by one with continuous or intermittent light and to detect, as the case may be, the flow of a continuous or intermittent photoelectric current.

By virtue of the procedures described, the testing of the junctions of diodes in a parallel or series-parallel assembly becomes very simple, whereas it was relatively complicated with traditional methods.

I claim:

1. A method for testing diodes with exposed junctions and distributed into groups within which they are connected in parallel, the various groups of diodes being themselves connected together in series, the method comprising the steps:

intermittently illuminating the junction of a diode being tested in one of the groups;

continuously illuminating the junctions of at least one diode of each remaining group causing it to switch to a conducting state, the continuous illumination occurring during intermittent illumination of the diode being tested; and detecting the flow of intermittent photocurrent in the connected diodes, signifying proper operation of the diode under test.

2. A system for testing a plurality of diodes with exposed junctions and distributed into groups within which they are connected in parallel, the various groups of diodes being themselves connected together in series, the testing system comprising:

an array of eletroluminescent diodes equal in number to the diodes in the groups and positioned in corresponding adjacent alignment therewith, the electroluminescent diodes selectively emitting light having wavelengths within the range of junction photoelectric sensitivity;

control means connected to the electroluminescent diodes for intermittently illuminating the junction of a tested diode in one of the groups;

the control means further causing continuous illumination of the junctions of at least one diode of each remaining group resulting in its switching to a conducting state, the continuous illuminination occurring during intermittent illumination;

a photocurrent detector having an input connected to terminals of the connected diodes; and means connecting the control means to the detector for synchronizing operation of the detector and the electroluminescent diodes;

proper operation of the diode under test being verified upon detecting the flow of intermittent photocurrent in the connected diodes.

3. The method set forth in claim 1 further comprising the steps of sequentially terminating the continuous illumination of the diodes in the remaining groups; and detecting the termination of intermittent current flow in the connected diodes, signifying the absence of a short circuit in any of the diodes of the remaining groups.

* * * * *